United States Patent [19]
Rahman et al.

[11] Patent Number: 6,096,477
[45] Date of Patent: Aug. 1, 2000

[54] FRACTIONATED NOVOLAK RESIN FROM CRESOL-FORMALDEHYDE REACTION MIXTURE AND PHOTORESIST COMPOSITION THEREFROM

[75] Inventors: M. Dalil Rahman, Flemington; Ping-Hung Lu, Bridgewater; Michelle Cook, Somerville, all of N.J.

[73] Assignee: Clariant Finance (BVI) Limited, Virgin Islands (Br.)

[21] Appl. No.: 09/251,900

[22] Filed: Feb. 19, 1999

Related U.S. Application Data

[62] Division of application No. 08/768,541, Dec. 18, 1996, Pat. No. 5,910,559.

[51] Int. Cl.[7] .................................................. G03C 1/93
[52] U.S. Cl. ............................................... 430/270.1
[58] Field of Search ..................... 430/270.1; 528/137, 528/142, 144, 491, 494, 495, 499, 502 R

[56] References Cited

U.S. PATENT DOCUMENTS 5,073,622  12/1991  Wojtech et al. ..................... 528/486

OTHER PUBLICATIONS

Sumitomo Chemical, WPIDS Abstract 87–252532, abstracting JP62172341, Jul. 1987.

*Primary Examiner*—Jeffrey C. Mullis
*Attorney, Agent, or Firm*—Andrew F. Sayko, Jr.

[57] ABSTRACT

The present invention provides a method for producing a film forming, fractionated novolak resin having consistent molecular weight and superior performance in photoresist composition, by isolating such novolak resin fractions without high temperature distillation. A method is also provided for producing photoresist composition from such a fractionated novolak resin and for producing semiconductor devices using such a photoresist composition.

4 Claims, No Drawings

FRACTIONATED NOVOLAK RESIN FROM CRESOL-FORMALDEHYDE REACTION MIXTURE AND PHOTORESIST COMPOSITION THEREFROM

This application is a division of application Ser. No. 08/768,541 filed Dec. 18, 1996, now U.S. Pat. No. 5,910,559.

BACKGROUND OF THE INVENTION

The present invention relates to a process for producing a fractionated film forming novolak resin having consistent molecular weight (no substantial depolymerization) and high lithographic performance, and for using such a novolak resin in light-sensitive compositions. The present invention also relates to a process for making a superior quality light-sensitive composition useful as a positive-working photoresist. Further, the present invention relates to a process for coating substrates with these light-sensitive compositions, as well as the process of coating, imaging and developing these light-sensitive mixtures on such substrates.

Photoresist compositions are used in microlithography processes for making miniaturized electronic components, such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Novolak resins are frequently used as a polymeric binder in liquid photoresist formulations. These resins are typically produced by conducting a condensation reaction between formaldehyde and one or more multi-substituted phenols, in the presence of an acid catalyst, such as oxalic acid, maleic acid, or maleic anhydride. In producing sophisticated semiconductor devices, it has become increasingly important to provide a film forming novolak resin of superior quality in terms of dissolution rate, better binding properties with a diazonaphthoquinone, and heat resistance.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

DESCRIPTION OF THE PRIOR ART

In the recent years there has been significant progress in novolak resin synthesis. It has been reported that under vigorous synthetic conditions the structure of novolak resin changes, especially when high concentration of acid catalyst and high temperature is used, Rahman et al, "Rearrangement of Novolak Resin", presented at SPIE conference, 1994; Khadim et al "The Nature and Degree of Substitution Patterns in Novolaks by Carbon-13 NMR Spectroscopy", presented at SPIE conference, 1993. In a typical novolak reaction, a reactor is charged with phenolic compounds, an acid catalyst such as oxalic acid, maleic acid, p-toluene sulphonic acid or any mineral acid, and heated to about 95 to 100° C. Formaldehyde is slowly added and the mixture is heated at reflux for about 6 hours. At the end of the condensation period, the reactor is converted to distillation, and the temperature is raised to about 200° C. At this point vacuum is slowly drawn, the temperature is raised to about 220° C., and the pressure is reduced to below about 20 mm Hg. After the volatiles have been distilled off, the vacuum is released and the molten resin collected and allowed to cool. During the course of the above resin synthesis sequence, samples were taken at various temperatures and inspected by GPC (Gel Permeation Chromatography). It was found that there was a decrease of the weight average molecular weight (all molecular weights are weight average unless otherwise specified) of the polymer, especially in the temperature range between about 160–190° C. (Rahman et al, "The Effect of Lewis Bases on the Molecular Weight of Novolak Resins", presented at Ellenville Conference, 1994). The molecular weight decrease (depolymerization) was not observed unless the phenolic compounds are extremely pure. If the phenolic compounds contains a trace amount of a Lewis Base, such as a nitrogen base, the molecular weight decrease during the distillation process was not observed. In U.S. Pat. No. 5,476,750, assigned to the same assignee as the subject application and incorporated herein by reference, an improved process is disclosed to control molecular weight (avoid substantial depolymerization) by adjusting the amount of Lewis Base in the phenolic compounds before or after the condensation. It was disclosed that during the purification process of such phenolic compounds using an ion exchange resin, distillation, and/or a solvent extraction process, to remove metal ions, a minor amount of base present was also removed. Due to the absence of this base, the novolak resin was partially depolymerized during the manufacturing process. The physical properties of the depolymerized resin changed due to degradation and it was not useful for photoresist compositions. This problem can be substantially avoided by adjusting the level of Lewis Base before or after the condensation step of the novolak manufacturing process.

In copending U.S. patent application Ser. No. 366,634, filed on Dec. 30, 1994, assigned to the same assignee as the subject application and incorporated herein by reference, an improved process is disclosed for isolating a novolak resin at a temperature less than about 140° C. by using subsurface forced steam distillation to avoid high temperature molecular weight breakdown of the resin. (Rahman et al, "Isolation of Novolak Resin at Low Temperature", presented at SPIE Conference, 1996). It is known that a film forming novolak resin can be made by the condensation reaction of a mixture of phenolic monomers with an aldehyde source. Such novolak resin synthesis processes are disclosed in U.S. Pat. No. 5,346,799, incorporated herein by reference.

SUMMARY OF THE INVENTION

It has now been found that the novolak resin synthesis process can be further improved by isolating novolak fractions from the phenol formaldehyde condensation product at room temperature without any high temperature distillation. This can be accomplished by synthesizing the resin using a photoresist solvent, such as a monooxymonocarboxylic acid ester (such as disclosed in U.S. Pat. No. 5,215,857, incorporated herein by reference), as the reaction solvent. This is followed by the addition of water, preferably DI (deionized) water, thereby separating the condensation product (novolak resin) in the reaction solvent, leaving behind the unreacted phenols and useless monomer and oligomers in the remaining solution, which is removed, such as by suction. To the novolak resin solution, a water soluble organic polar solvent, such as acetone, dimethylformamide (DMF), dimethylsulfoxide, tetrahydrofuran (TBF), ethylene glycol or a $C_1$ to $C_3$ alkyl alcohol, such as ethanol, propanol or, preferably, methanol) and DI water are added, preferably with stirring. The low molecular weight resin, oligomers, and monomers dissolve in the water/organic polar solvent/reaction solvent system and separate as the top layer. The high molecular weight novolak resin dissolves in the reaction solvent and separates as the bottom layer. The top layer is removed, such as by suction, hence the novolak resin is fractionated. The process is repeated several (2 to 10) times, preferably 3 to 8, more preferably 4 to 7, and most preferably 4 to 5 times. Finally, additional reaction solvent is added and any remaining water and organic polar solvent are removed, such as by distillation at low temperature under vacuum.

After removing this low molecular weight fraction, one or more other photoresist solvents can be added and then the solvent mixture treated, such as by distillation under vacuum, to remove water, organic polar solvent and some portion of the reaction/photoresist solvent to thereby isolate the novolak resin fraction in a mixture of the reaction solvent and the additional photoresist solvent. Such mixture of solvents comprises the reaction solvent and the other solvent (s) in the ratio of 95:5 to 5:95, preferably 90:10 to 10:90, more preferably 80:20 to 20:80, even more preferably 30:70 to 70:30, even more preferably 40:60 60:40, and most preferably about 50:50. The said other photoresist solvent(s) may comprise propylene glycol methyl ether acetate, 3-methoxy-3-methyl butanol, ethylene glycol monomethyl ether, ethylene glycol monoethyl ether, diethylene glycol monoethyl ether, ethylene glycol monoethyl ether acetate, ethylene glycol monomethyl acetate, methyl ethyl ketone. The reaction solvent preferably comprises a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyactetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate (ethyl lactate), ethyl 3-hydroxypropionate, propyl 2-oxypropionate, methyl 2-ethoxypropionate, or propyl 2-methoxy propionate.

The present invention relates to a process for synthesizing novolak resin in a reaction solvent which is a photoresist solvent and performing a fractionation of the novolak resin to provide a film forming novolak resin having high lithographic performance in light-sensitive compositions. The invention also relates to a process for producing such a photoresist composition containing such a novolak resin. The invention further relates to a process for producing semiconductor devices using such photoresists containing such a novolak resin, photoresist solvent(s), and a photosensitizer.

Film forming novolak resins having a consistent molecular weight (no substantial depolymerization) and high lithographic performance may be obtained by condensing formaldehyde having a very low level of metal ions with one or more phenolic compounds, such as m-cresol, p-cresol, 2,4 and 2,5-dimethylphenol, 3,5-dimethylphenol, and 2,3,5-trimethylphenol, having a very low level of metal ions. The condensation reaction is preferably carried out in the presence of an acid catalyst, such as oxalic acid, maleic acid, maleic anhydride, p-toluene sulphonic acid or sulfuric acid.

In the process of the present invention, to the final fraction more reaction solvent is added and the residual water is removed, such as by low temperature vacuum distillation, to obtain a novolak resin having a very consistent molecular weight with superior lithographic performance in photoresist compositions.

The present invention provides a process for producing a film forming novolak resin which comprises:

a) condensing (reacting) formaldehyde with one or more phenolic compounds, in the presence of an acid catalyst and a reaction solvent, the reaction solvent being a photoresist solvent, preferably a monooxymonocarboxylic acid ester, (the same solvent which comprises the photoresist solvent for the photoresist composition in which the novolak resin condensation product is utilized) and thereby producing a novolak resin polymeric condensation product;

b) adding water, preferably DI water, to the reaction mixture and thereby forming two solution layers, a top layer comprising a solution of unreacted phenolic compounds, and novolak oligomers and monomers in water and a bottom layer comprising a solution of the remaining reaction mixture in reaction solvent, and removing the top layer, such as by decanting or by suction;

c) adding a water soluble organic polar solvent and water to the remaining bottom solution layer, in the ratio of water soluble organic polar solvent:water ratio of 5:95 to 95:5, preferably 10:90 to 90:10, more preferably 20:80 to 80:20, even more preferably 30:70 to 70:30, even more preferably 40:60 to 60:40, and most preferably about 50:50, and thereby again forming two solution layers, a bottom layer comprising a solution of the novolak resin condensation product in reaction solvent and a top layer comprising a solution of low molecular weight novolak, novolak oligomers and novolak monomer in a solvent comprising water/water soluble organic polar solvent/ reaction solvent, and removing the top layer, such as by decanting or by suction;

d) repeating steps b) and c) 2 to 10 times, preferably 3 to 8 times, more preferably 4 to 7 times, and most preferably 4 to 5 times;

e) diluting the remaining novolak resin solution with a solvent comprising the reaction solvent and removing any remaining water and water soluble organic polar solvent, such as by distilling the resin solution under vacuum and low temperature, and thereby producing a film forming, fractionated novolak resin.

The present invention further provides a process for producing a positive photoresist composition having superior lithographic performance. The subject process comprises:

a) condensing formaldehyde with one or more phenolic compounds, in the presence of an acid catalyst and a reaction solvent, the reaction solvent being a photoresist solvent, preferably a monooxymonocarboxylic acid ester;

b) adding water, preferably DI water, to the reaction mixture and thereby forming two solution layers, a top layer comprising a solution of unreacted phenolic compounds, and novolak oligomers and monomer in water, and a bottom layer comprising a solution of the remaining reaction mixture in reaction solvent, and removing the top layer, such as by decanting or by suction;

c) adding a water soluble organic polar solvent and water to the remaining bottom solution layer, in the ratio of water soluble organic polar solvent:water ratio of 5:95 to 95:5, preferably 10:90 to 90:10, more preferably 20:80 to 80:20, even more preferably 30:70 to 70:30, even more preferably 40:60 to 60:40, and most preferably about 50:50, and thereby again forming two solution layers, a bottom layer comprising a solution of the novolak resin condensation product in reaction solvent and a top layer comprising a solution of low molecular weight novolak, novolak oligomers and novolak monomers in a solvent comprising water/water soluble organic polar solvent/ reaction solvent, and removing the top layer, such as by decanting or by suction;

d) repeating steps b) and c) 2 to 10 times, preferably 3 to 8 times, more preferably 4 to 7 times, and most preferably 4 to 5 times;

e) diluting the remaining novolak resin solution with a solvent comprising the reaction solvent, and removing any remaining water and water soluble organic polar solvent, such as by distilling the resin solution under vacuum and low temperature, thereby producing a film forming, fractionated novolak resin; and f) providing an admixture of 1) a photosensitive component in an amount sufficient to photosensitive a photoresist composition; 2) the film forming novolak resin from step e); and 3) a suitable photoresist solvent which comprises the same solvent as the reaction solvent, and thereby forming a photoresist composition.

The invention further provides a method for producing a semiconductor device by producing a photo-image on a substrate by coating a suitable substrate with a positive working photoresist composition. The subject process comprises:

a) condensing formaldehyde with one or more phenolic compounds, in the presence of an acid catalyst and a reaction solvent, the reaction solvent being a photoresist solvent, and thereby producing a novolak resin polymeric condensation product;

b) adding water, preferably DI water, to the reaction mixture and thereby forming two solution layers, a top layer comprising a solution of unreacted phenolic compounds in water and a bottom layer comprising a solution of the remaining reaction mixture in reaction solvent, and removing the top layer, such as by decanting or by suction;

c) adding a water soluble organic polar solvent and water to the remaining bottom solution layer in the ratio of water soluble organic polar solvent:water ratio of 5:95 to 95:5, preferably 10:90 to 90:10, more preferably 20:80 to 80:20, even more preferably 30:70 to 70:30, even more preferably 40:60 to 60:40, and most preferably about 50:50, and thereby again forming two solution layers, a bottom layer comprising a solution of the novolak resin condensation product in reaction solvent and a top layer comprising a solution of low molecular weight novolak, novolak oligomers and novolak monomer in a solvent mixture comprising water/water soluble organic polar solvent/reaction solvent and removing the top layer, such as by decanting or by suction;

d) repeating steps b) and c) 2 to 10 times, preferably 3 to 8 times, more preferably 4 to 7 times, and most preferably 4 to 5 times;

e) diluting the remaining novolak resin solution with a solvent comprising the reaction solvent, and removing any remaining water and water soluble organic polar solvent, such as by distilling the resin solution under vacuum and low temperature, and thereby producing a film forming, fractionated novolak resin;

f) providing an admixture of: 1) a photosensitive component in an amount sufficient to photosensitive a photoresist composition; 2) the film forming novolak resin from step e); and 3) a suitable photoresist solvent which comprises the same solvent as the reaction solvent, and thereby forming a photoresist composition;

g) coating a suitable substrate with the photoresist composition of step f);

h) heat treating the coated substrate of step g) until substantially all of the photoresist solvent is removed; image-wise exposing the photosensitive composition and removing the image-wise exposed areas of such composition with a suitable developer, such as an aqueous alkaline developer. Optionally one may also perform a baking of the substrate either immediately before or after the removing step.

DESCRIPTION OF THE PREFERRED EMBODIMENT

Novolak resins have been commonly used in the art of photoresist manufacture as exemplified by "Chemistry and Application of Phenolic Resins", Knop A. And Scheib, W.; Springer Verlag, New York, 1979 in Chapter 4. Similarly, o-quinone diazides are well known to the skilled artisan as demonstrated by "Light Sensitive Systems", Kosar, J.; John Wiley & Sons, New York, 1965 Chapter 7.4. However, the instant invention has found that the use of particular resins isolated without high temperature distillation, as opposed to those taught in the prior art, produces a photoresist having a superior resolution and depth of focus.

Optional ingredients for the photoresist compositions of the present invention include colorants, dyes, anti-striation agents, leveling agents, plasticizers, adhesion promoters, speed enhancers, solvents and such surfactants as non-ionic surfactants, which may be added to the solution of novolak resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of novolak and sensitizer. Plasticizers which may be used include, for example, phosphoric acid tri-(beta-chloroethyl)-ester; stearic acid; dicamphor; polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyl trichlorosilane; and gamma-amino-propyl triethoxysilane, up to about a 4 percent weight level, based on the combined weight of novolak and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and subsequent drying. Non-ionic surfactants that may be used include, for example, nonylphenoxy poly(ethyleneoxy) ethanol; octylphenoxy ethanol at up to about 10% weight levels, based on the combined weight of novolak and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coated substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

500g of phenolic compounds consisting of 5.0 moles of m-cresol and 3.0 moles of 3,5-xylenol, 1 mole of 2,3,5-trimethylphenol, and 330 g of ethyl lactate (ethyl 2-hydroxypropionate) ⅔ by weight of the phenols) were transferred to a four necked flask equipped with a condenser, a thermometer, and a dropping funnel. The reaction was allowed to continue for 6 hours at 95° C. A sample was taken and 175 g of deionized water (21% by weight of the batch) was added under stirring. Stirring was stopped after 10 minutes and reaction mixture was allowed to settle. Two layers formed. The top aqueous layer was siphoned off and discarded. A sample of the bottom resin layer was taken for GPC (fraction A). 300 g of ethyl lactate was then added under stirring and a mixture of 400 g deionized water and 100 g Methanol were added under stirring. Stirring was stopped after 10 minutes and reaction mixture allowed to settle. Two layers formed and the top aqueous layer was siphoned off and discarded. A sample of the bottom resin layer was taken for GPC (fraction B). 165 g of ethyl lactate and a 400 g/100 g mixture of deionized water and MeOH were added under stirring and allowed to stir for 5 minutes. Stirring was stopped and mixture allowed to settle. Two layers formed and the top layer was siphoned off. A sample of the bottom resin layer was taken for GPC (fraction C). One half of the resin in Ethyl lactate was transferred to another flask. To the remaining resin, 83 g of Ethyl lactate and a 200 g/50 g mixture of deionized water and MeOH were added under stirring. Stirring was stopped and two layers formed. The top layer was extracted. The last resin fraction was labeled as fraction D. Ethyl lactate was added to dissolve fractions C and D, which were then distilled at low temperature (75° C.) under vacuum (20 mm Hg) to remove excess water and Methanol. Ethyl lactate was added again to adjust the resin solution to 32% solids.

TABLE 1

| Example # | Lab Sample # | GPC MW$_w$ | P.D. |
|---|---|---|---|
| 1 | 1943-143 | 2418 | 2.51 |
|  | 1943-143A | 2179 | 2.45 |
|  | 1943-143B | 2300 | 2.40 |
|  | 1943-143C | 2273 | 2.37 |
|  | 1943-143D | 2359 | 2.30 |
| 2 | 1976-64A | 2075 | 1.87 |
|  | 1976-68-1 | 1838 | 1.81 |
|  | 1976-68-2 | 1816 | 1.80 |
|  | 1976-68-3 | 1866 | 1.73 |
|  | 1976-68-4 | 2014 | 1.81 |

P.D. = Polydispersity = MW$_w$/MW$_n$
MW$_w$ = Weight Average Molecular Weight
MW$_n$ = Number Average Molecular Weight

EXAMPLE 2

300 grams of phenolic compounds consisting of 6.0 moles of m-cresol, 2.0 moles of 3,5-xylenol, and 2.0 moles of 2,3,5-trimethylphenol, together with 200 grams of ethyl lactate were transferred to a four necked flask equipped with a condenser, a thermometer, and a dropping funnel. 0.9 gram of oxalic acid (0.3% by weight of the phenolic compounds) was added and the flask was heated to 95° C. 140 g (molar ratio of phenols/formaldehyde 1/0.66) was added dropwise over one and a half hours. The reaction was allowed to continue for 6 hours at 95° C. After condensation a sample was taken (resin 2) and 106 g DI water (16.6%, by weight, of the batch) were added with stirring. Stirring was stopped and solution was allowed to settle. Two layers were formed and the top layer was siphoned off (saved as wash A). A sample of the bottom resin layer was taken (fraction 1). A 200 g solution (1/1): methanol/water was then added with stirring. Stirring was stopped and the solution allowed to settle. Two layers formed and the top layer was siphoned off (saved as wash B) and a sample of the resin layer remaining was taken (fraction 2). A 300 g solution (1/1/1): methanol/water/ethyl lactate was then added with stirring. Stirring was stopped and the solution allowed to settle. Two layers formed and the top layer was siphoned off (saved as wash C) and a sample of resin layer was kept(fraction 3). Another 300 g of solvent (1/1/1) ethyl lactate/methanol/water was then added with stirring. Stirring was stopped and solution was allowed to settle. The top layer was siphoned off (saved as wash D). More ethyl lactate was added, and residual water and methanol were then removed by vacuum at low temperature (20 mm Hg at 75° C.). The final resin solution in ethyl lactate was fraction 4. Analytical data is shown in Table 1.

EXAMPLE 3

A 50 gram photoresist test sample was prepared by mixing the following:
 4% PAC-I, which was a proprietary photoactive compound prepared from a BIPC-BIOC-F (4,4'-methylene-bis-[6-[(4-hydroxyphenyl)methyl]-2,5-dimethylphenoll backbone and 2,1,5 diazosulphonyl chloride esterification in the range of 60 to 90%, (available from AZ Photoresist Products, Hoechst Celanese Corp.);
 2% PAC-II, which was a proprietary photoactive compound prepared from a BIPC-BIOC-F backbone and 2,1,5 diazosulphonyl chloride esterification in the range of 30 to 60%, (available from AZ Photoresist Products, Hoechst Celanese Corp.);

16% of the resin from Example 1 fraction C;

0.008% KP-341 surfactant (available from Shin-Etsu Chem. Co. (2% in ethyl lactate);

66% Ethyl lactate; and

12% n-Butyl acetate.

The resist sample was coated onto a hexamethyldisilazane (HMDS) primed silicon wafer to 1.083 μm (micrometers) film thickness using a soft bake at 90° C. for 90 seconds on an SVG® 8100 hot plate. The 15×21 focus exposure matrix was printed on the coated wafers using a 0.54 NA NIKON® i-line stepper and a NIKON® resolution reticle. The exposed wafers were PEB (post exposure baked) at 110° C. for 60 seconds on a in line hot plate. The wafers were then developed using AZ® 300 MIF TMAH (tetramethyl ammonium hydroxide-2.38%) developer at 23° C. The developed wafers were examined using a HITACHI® S-400 SEM (scanning electron microscope). A nominal dose (Dose to Print, DTP) was measured at the best focus, the dose required to precisely replicate a given feature. Resolution and depth of focus (DOF) were measured and are shown in Table 2 below: e.g. 0.4 μ lines/space.

EXAMPLE 4

A 50 gram photoresist test sample was prepared by mixing the following:

4% PAC-I (a proprietary photoactive compound prepared from a BIPC-BIOC-F backbone and 2,1,5 diazosulphonyl chloride esterification in the range of 60 to 90%, available from AZ Photoresist Products, Hoechst Celanese Corp.);

2% PAC-II (a proprietary photoactive compound prepared from BIPC-BIOC-F backbone and 2,1,5 diazosulphonyl chloride esterification in the range of 30 to 60%, available from AZ Photoresists, Hoechst Celanese Corp.);

16% of the resin from example 1 fraction D;

0.008% KP-341 surfactant (available from Shin-Etsu Chem. Co.(2% in ethyl lactate);

66% Ethyl lactate; and

12% n-Butyl acetate.

The photoresist resist sample was coated onto a hexamethyldisilazane (HMDS) primed silicon wafer to a 1.083 μm (micrometers) film thickness, using a soft bake at 90° C. for 90 seconds on a SVG® 8100 hot plate. The 15×21 focus exposure matrix was printed on the coated wafers using a 0.54 NA NIKON® i-line stepper and a NIKON® resolution reticle. The exposed wafers were PEB (post exposure baked) at 110° C. for 60 seconds on a in line hot plate. The wafers were then developed using AZ® 300 MIF TMAH (tetramethyl ammonium hydroxide-2.38%) developer @ 23° C. The developed wafers were examined using a eHITACHI® S400 SEM (scanning electron microscope). A nominal dose (Dose to Print, DTP) is measured at the best focus by the SEM and displaed on the photomicrograph, the dose required to precisely replicate a given feature. Resolution and depth of focus (DOF) were measured (a range of defocus settings where the given feature size can be replicated) and are shown in Table 2 below: e.g. 0.4 μ lines/space.

EXAMPLE 5

A 50 gram photoresist test sample was prepared by mixing the following:

4% PAC-I (a proprietary photoactive compound prepared from a BIPC-BIOC-F backbone and 2,1,5 diazosulphonyl chloride esterification in the range of 60 to 90%, available from AZ Photoresist Products, Hoechst Celanese Corp.);

2% PAC-II (a proprietary photoactive compound prepared from a BIPC-BIOC-F backbone and 2,1,5 diazosulphonyl chloride esterification in the range of 30 to 60%, available from AZ Photoresist Products, Hoechst Celanese Corp.);

16% resin from Example 2 fraction 4;

0.008% KP-341 surfactant (available from Shin-Etsu Chem. Co., 2% in ethyl lactate);

66% ethyl lactate; and

12% n-Butyl acetate.

The photoresist resist sample was coated onto a hexamethyldisilazane (HMDS) primed silicon wafer to 1.083 μm (micrometers) thickness using a soft bake at 90° C. for 90 seconds on a SVGC 8100 hot plate. The 15×21 focus exposure matrix was printed on the coated wafers using a 0.54 NA NIKON® i-line stepper and a NIKON® resolution reticle. The exposed wafers were PEB (post exposure baked) at 110° C. for 60 seconds on a in line hot plate. The wafers were then developed using AZ® 300 MIF TMAH (tetramethyl ammonium hydroxide-2.38%) developer @ 23° C. The developed wafers were examined using a HITACHI® S-400 SEM (scanning electron microscope). A nominal dose (Dose to Print, DTP) is measured at the best focus, the dose required to precisely replicate a given feature. Resolution and depth of focus (DOF) were measured and are shown in Table 2 below: e.g. 0.41 μ lines/space.

TABLE 2

| Example # | Resin From | DTP | Resolution | DOF |
| --- | --- | --- | --- | --- |
| 3 | Example 1; fraction C | 175 | 0.34 | (−0.8/−0.2) |
| 4 | Example 1; fraction D | 135 | 0.34 | not good |
| 5 | Example 2; fraction 4 | 175 | 0.34 | (−0.2/0.2) |

COMPARATIVE EXAMPLE 1

250 grams of phenolic compounds consisting of 5.0 moles of m-cresol and 3.0 moles of 3,5-xylenol were transferred to a four necked flask equipped with a condenser, a thermometer, and a dropping funnel. 2.5 grams of oxalic acid (1% by weight of the phenols) was added and the flask was heated to 95° C. 123.0 g of formaldehyde (molar ratio of phenols/formaldehyde 1/0.685) were added dropwise over one and a half hours. The reaction was allowed to continue for 6 hours at 95° C. The reaction mixture was distilled up to 190° C. to remove water and solvent, and then distilled under vacuum at 210° C. to remove unreacted phenolic compounds. The molted resin was collected in an aluminum tray. A photoresist formulation was made according to the procedure of Example 3, except that the novolak resin was used from Comparative Example 1 and studied using the same procedure as Example 3. It was found that the performance of the resist (Table 3) was not good as compared to Example 3 and 5.

TABLE 3

| Example # | DTP | Resolution | DOF |
| --- | --- | --- | --- |
| Comparative Example 1 | 160 | Pattern fell over at 0.38 micron | (−.6/−0.8) |

What is claimed is:

1. A method for producing a positive photoresist composition having superior lithographic performance comprising:
   a) condensing formaldehyde with one or more phenolic compounds, in the presence of an acid catalyst and a reaction solvent, the reaction solvent being a photoresist solvent;
   b) adding water to the reaction mixture and thereby forming two solution layers, a top layer comprising a solution of unreacted phenolic compounds, and novolak oligomers and monomer in water, and a bottom layer comprising a solution of the remaining reaction mixture in reaction solvent, and removing the top layer;
   c) adding a water soluble organic polar solvent and water to the remaining bottom solution layer, in the ratio of water soluble organic polar solvent:water ratio of 5:95 to 95:5, and thereby again forming two solution layers, a bottom layer comprising a solution of the novolak resin condensation product in reaction solvent and a top layer comprising a solution of low molecular weight novolak, novolak oligomers and novolak monomers in a solvent comprising water/water soluble organic polar solvent/ reaction solvent, and removing the top layer;
   d) repeating steps b) and c) 2 to 10 times for the bottom layer remaining after step c);
   e) diluting the remaining novolak resin solution with a solvent comprising the reaction solvent, and removing any remaining water and water soluble organic polar solvent, thereby producing a film forming, fractionated novolak resin; and
   f) providing an admixture of: 1) a photosensitive component in an amount sufficient to photosensitive a photoresist composition: 2) the film forming novolak resin from stop e); and 3) a suitable photoresist solvent which comprises the same solvent as the reaction solvent, and thereby forming a photoresist composition.

2. The method of claim 1 where in said acid catalyst is oxalic add, maleic acid, maleic anhydride, sulfuric acid, or p-toluene sulphonic acid.

3. The method of claim 1 wherein the water soluble organic polar solvent is acetone or a $C_1$–$C_3$ alkyl alcohol.

4. The method of claim 1 wherein the reaction solvent is a monomonocarboxylic acid ester.

* * * * *